US008875080B1

(12) United States Patent  (10) Patent No.: US 8,875,080 B1
Parks et al.  (45) Date of Patent: Oct. 28, 2014

(54) PROGRAMMABLE MACROS FOR METAL/VIA PROGRAMMABLE GATE ARRAY INTEGRATED CIRCUITS

(71) Applicant: Baysand Inc., Morgan Hill, CA (US)

(72) Inventors: Jonathan C Parks, San Jose, CA (US); Yin Hao Liew, Penang (MY); Jeremy Lee Jia Jian, Penang (MY)

(73) Assignee: Baysand Inc., Morgan Hill, CA (US)

( * ) Notice: Subject to any disclaimer, the term of this patent is extended or adjusted under 35 U.S.C. 154(b) by 0 days.

(21) Appl. No.: 14/096,292

(22) Filed: Dec. 4, 2013

(51) Int. Cl.
*G06F 17/50* (2006.01)
(52) U.S. Cl.
CPC .................................. *G06F 17/5077* (2013.01)
USPC .......................................... 716/128; 716/139
(58) Field of Classification Search
None
See application file for complete search history.

(56) References Cited

U.S. PATENT DOCUMENTS

| | | | |
|---|---|---|---|
| 5,850,564 A * | 12/1998 | Ting et al. | 712/37 |
| 6,160,420 A * | 12/2000 | Gamal et al. | 326/41 |
| 7,030,651 B2 * | 4/2006 | Madurawe | 326/41 |
| 7,051,313 B1 * | 5/2006 | Betz et al. | 716/113 |
| 7,129,744 B2 * | 10/2006 | Madurawe | 326/38 |
| 7,404,154 B1 * | 7/2008 | Venkatraman et al. | 326/103 |
| 7,627,848 B2 * | 12/2009 | Madurawe | 716/138 |
| 7,673,273 B2 * | 3/2010 | Madurawe et al. | 716/138 |
| 7,689,960 B2 * | 3/2010 | Park et al. | 716/119 |
| 8,230,375 B2 * | 7/2012 | Madurawe | 716/117 |
| 8,352,899 B1 * | 1/2013 | Yap et al. | 716/132 |

* cited by examiner

*Primary Examiner* — Leigh Garbowski
(74) *Attorney, Agent, or Firm* — Useful Arts IP

(57) ABSTRACT

A design methodology is provided to fully automate the creation of multiple-personality programmable macros for use in metal/via programmable ICs. Programmability is achieved using programmable switches, each of which may include one or more metal traces and/or vias on one or more layers configured in series, in parallel, or in combination. Multiple overlapping switches may exist in the same location. That is, switches may be defined that use some of the same resources. Any one of the switches may be "turned on," while the remaining switches remain turned off. As part of the design methodology, different nets or parts of an electrical circuit design are programmed by replacing the switches with hard connections that close the circuit, or with no connections so as to open the circuit, or cause the circuit to remain open. The methodology allows for sharing routing or programming resources to achieve optimize layout area usage.

6 Claims, 10 Drawing Sheets

V23-M3-V23 Switch
*Fig. 3A*
V23-M3-V34-M4 Switch
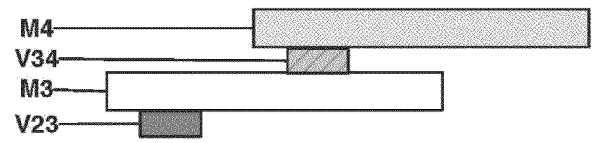
*Fig. 3B*
*Fig. 4A*
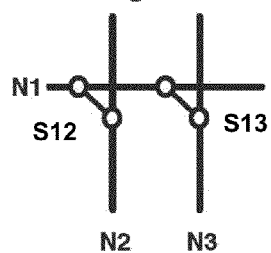
*Fig. 4B*
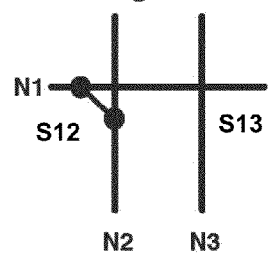
*Fig. 4C*
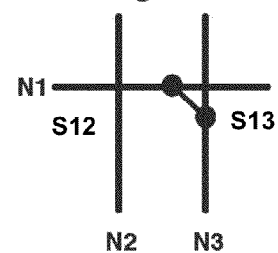
*Fig. 5A*
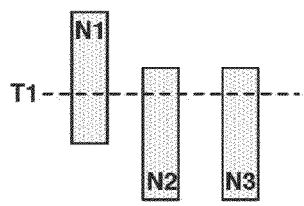
*Fig. 5B*
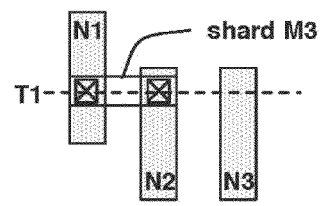
*Fig. 5C*
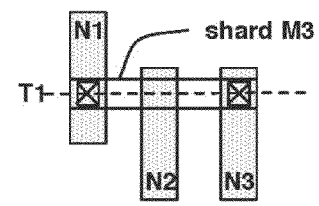
*Fig. 6A*
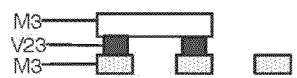
*Fig. 6B*
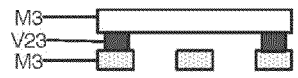
*Fig. 6C*

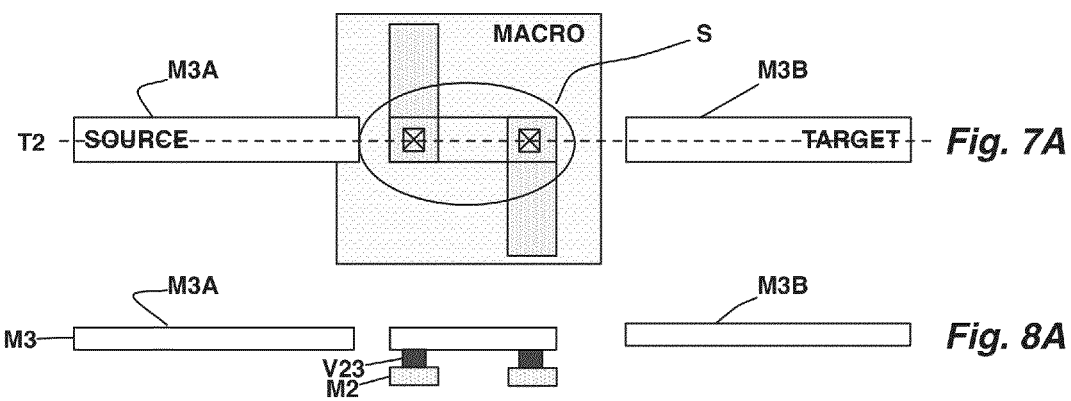
Fig. 7A
Fig. 8A
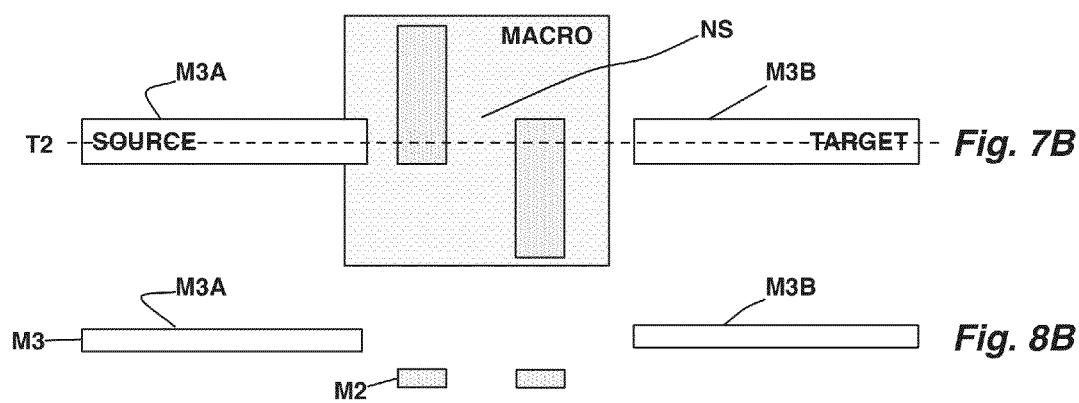
Fig. 7B
Fig. 8B
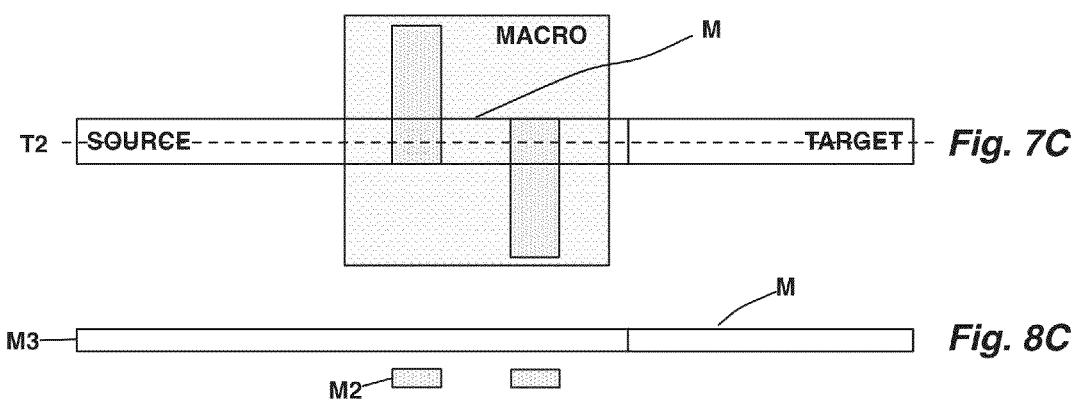
Fig. 7C
Fig. 8C

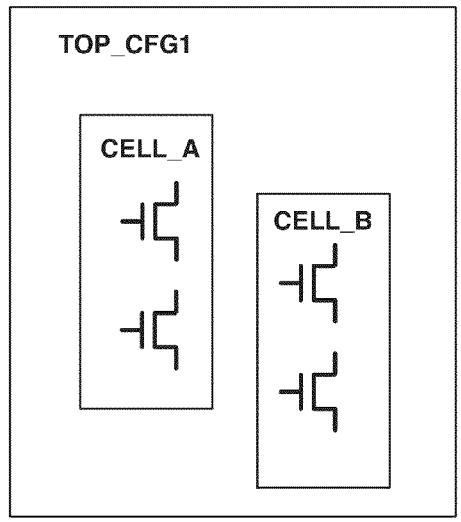
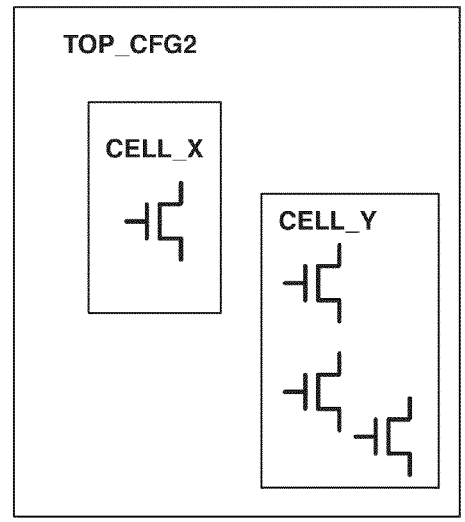
Fig. 9A                    Fig. 9B
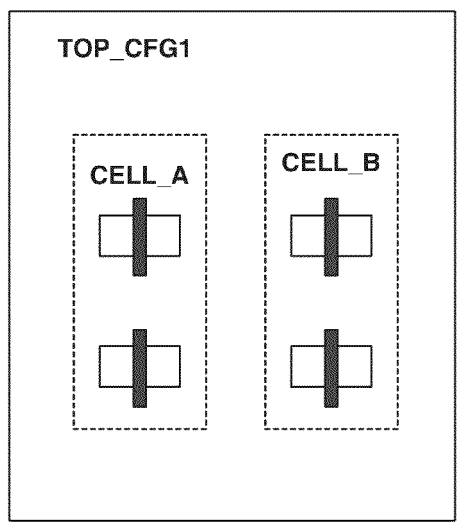
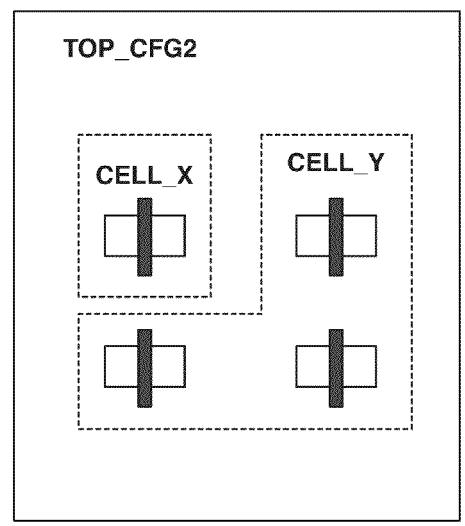
Fig. 10A                   Fig. 10B

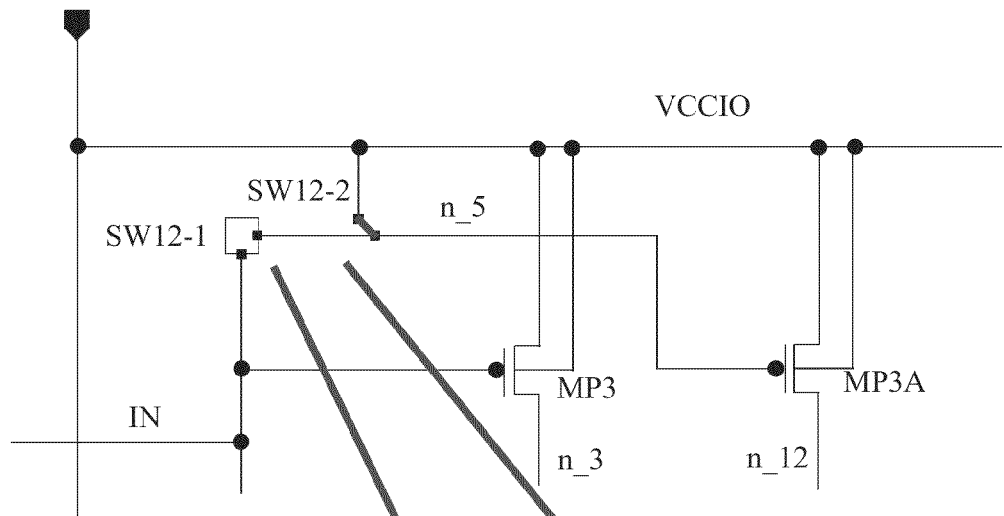
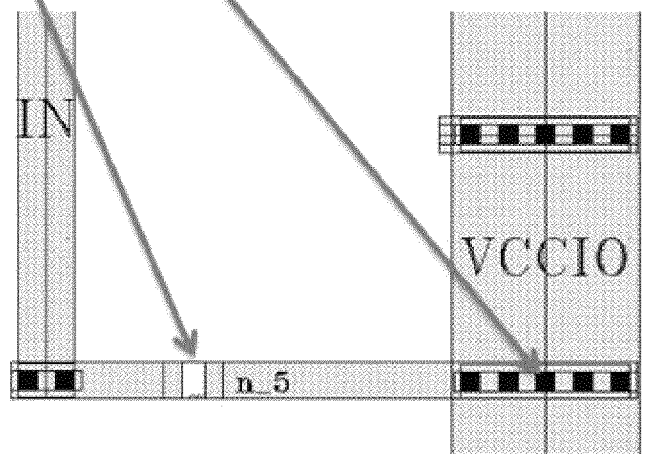
*Fig. 12C*

PROGRAMMABLE MACROS FOR METAL/VIA PROGRAMMABLE GATE ARRAY INTEGRATED CIRCUITS

BACKGROUND

Metal/via programmable gate array integrated circuits (ICs) use macrocells, or "macros," to define the function of the IC. Such macros include, for example, 10 buffers, PLLs, DLLs, memory cells, etc. Such macros have typically been non-programmable. As a result, making derivative ICs from an existing metal/via programmable gate array IC has typically required extensive re-design. One possible reason for the lack of programmability is the lack of a suitable design methodology to utilize the programmable layer.

BRIEF DESCRIPTION OF THE DRAWING FIGURES

The present invention may be understood from the following description in conjunction with the appended drawing figures. In the drawing:

FIG. 3A is a cross-sectional view of one example of a switch that may be used in the customized flow of FIG. 2A and FIG. 2B.

FIG. 3B is a cross-sectional view of another example of a switch that may be used in the customized flow of FIG. 2A and FIG. 2B.

FIG. 4A is a schematic representation of a portion of a base (uncommitted) macrocell including soft switches that allow for customization (programming, personalization) of the macrocell.

FIG. 4B and FIG. 4C are schematic representations of different customizations of the macrocell of FIG. 4A.

FIGS. 5A-5C are layout representations of the macrocells of FIGS. 4A-4C.

FIGS. 6A-6C are cross-sections views of the macrocells of FIGS. 4A-4C.

FIG. 7A is a layout representation of a portion of a macrocell in which a switch blocks a routing track.

FIG. 7B is a layout representation of the macrocell of FIG. 7A in which the switch or internal signal metal has been removed because the macro cell is unused.

FIG. 7C is a layout representation of the macrocell of FIG. 7B in which a freed routing track has been used to connect a signal source and a signal target.

FIGS. 8A-8C are cross-sectional views of the macrocells of FIGS. 7A-7C.

FIG. 9A is a schematic representation of a first circuit configuration including macros A and B.

FIG. 9B is a schematic representation of a second circuit configuration in which a device from macro A in FIG. 9A has been reallocated to macro B, resulting in new macros X and Y.

FIG. 10A is a layout representation of diffusion and poly layers of the circuit configuration of FIG. 9A.

FIG. 10B is a layout representation of diffusion and poly layers of the circuit configuration of FIG. 9B.

FIG. 12C is a schematic and layout representation of a second customization of the circuit of FIG. 12A.

DETAILED DESCRIPTION

Summary

Figure 1A:
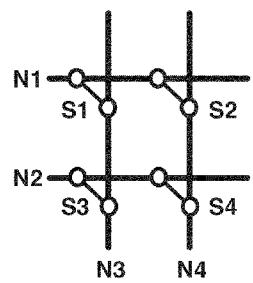
FIG. 1A is a schematic representation of a portion of a base (uncommitted) macrocell including soft switches that allow for customization (programming, personalization) of the macrocell.

A design methodology is provided to fully automate the creation of multiple-personality programmable macros for use in metal/via programmable ICs. Programmability is achieved using programmable switches, each of which may include one or more metal traces and/or vias on one or more layers configured in series, in parallel, or in a combination series and parallel configuration. Furthermore, multiple overlapping switches may exist in the same location. That is, switches may be defined that use some of the same resources. Any one of the switches sharing a particular resource may be turned on, while others of the switches are turned off. As part of the design methodology, different nets or parts of an electrical circuit design are programmed by replacing the switches with hard connections that close the circuit, or with no connections so as to open the circuit, or cause the circuit to remain open. The methodology allows for sharing routing or programming resources to achieve optimize layout area usage.

The creation of schematic and layout for different personality macros may be fully automated based on a single schematic and layout. Hard switching devices may be eliminated completely from the final programmed schematic or netlist and circuit design layout. They results a better physical and behavioral representation of the design, fully compatible with existing EDA tools. During electrical rule checking, the connectivity can be more accurately extracted without the presence of switch devices. During parasitic extraction, a similar benefits realized, whereby the extraction result accuracy is improved without the need of modeling switch devices.

In one embodiment, a computer-implemented method is provided of designing a macro-based metal-programmable integrated circuit using at least one software-based design tool. In accordance with the method, each of multiple macros is represented by an un-customized schematic representation and an un-customized layout representation. User inputs to the software design tool are received and, based on the user inputs, the software-based design tool automatically generates at least one personalized macro represented by a customized schematic representation and a customized layout representation.

In another embodiment, a method of is provided of programmably interconnecting circuit nodes of macrocells of a metal programmable integrated circuit. During a design phase, each of multiple potential interconnections is represented as a switch, which may be represented as a line symbol, connecting at least two circuit nodes. For each of the potential interconnections, physical resources are reserved for connecting the circuit nodes, the physical resources including one or more vias, one or more metal lines, or both one or more vias and one or more metal lines. Different ones of the potential interconnections have different physical layouts. During a physical layout phase, a state of each of the potential interconnections is specified; and for each of the potential connections, layout is performed of the one or more vias, one or more metal lines, or both one or more vias and one or more metal lines of that potential connection.

In another embodiment, a macro design A can be transformed to macro design B (a different circuit design), by, within a particular level, removing all the programmable interconnect switches and existing interconnect, then replacing with a new set of programmable interconnect switches and interconnect. Each of the macro A and the macro B can be further programmed into different personality circuits through a switch programming flow.

DETAILED DESCRIPTION

Referring now to FIG. 1A, a diagram is shown of a portion of a circuit schematic that includes circuit nodes N1, N2, N3 and N4. In this example, nodes N1 and N2 are horizontal metal lines, and nodes N3 and N4 are vertical metal lines. The circuit schematic also includes "soft" programmable switches S1, S2, S3 and S4. Each switch is represented by a line between two circuit nodes and joined to the circuit nodes by unfilled circles. This representation represents the switch in its unprogrammed state. (Note that a switch can be represented by any other symbol as long as it is distinguishable from other circuit elements.) The circuit of FIG. 1A may represent some circuit nodes of a base macro that is uncommitted, or unprogrammed.

Figure 1B:
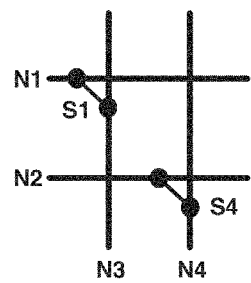
FIG. 1B through FIG. 1D are schematic representations of different customizations of the macrocell of FIG. 1A.
Figure 1C:
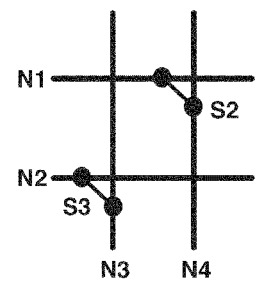
Figure 1D:
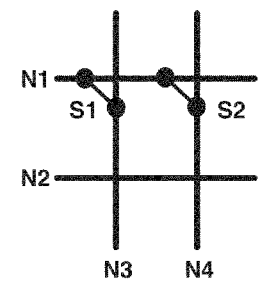

The switches S1-S4 may be programmed in various combinations and configurations to arrive at various customizations of the base macro, as illustrated in FIGS. 1B-1D. In the committed state, if a switch is turned on, the circles of that switch are filled in. In FIG. 1B, switches S1 and S4 are turned on, while switches S2 and S3 are turned off. Because they are turned off, they are omitted from the circuit schematic. In FIG. 1C, only switches S2 and S3 are turned on. In FIG. 1D, only switches S1 and S2 are turned on.

Figure 2A:
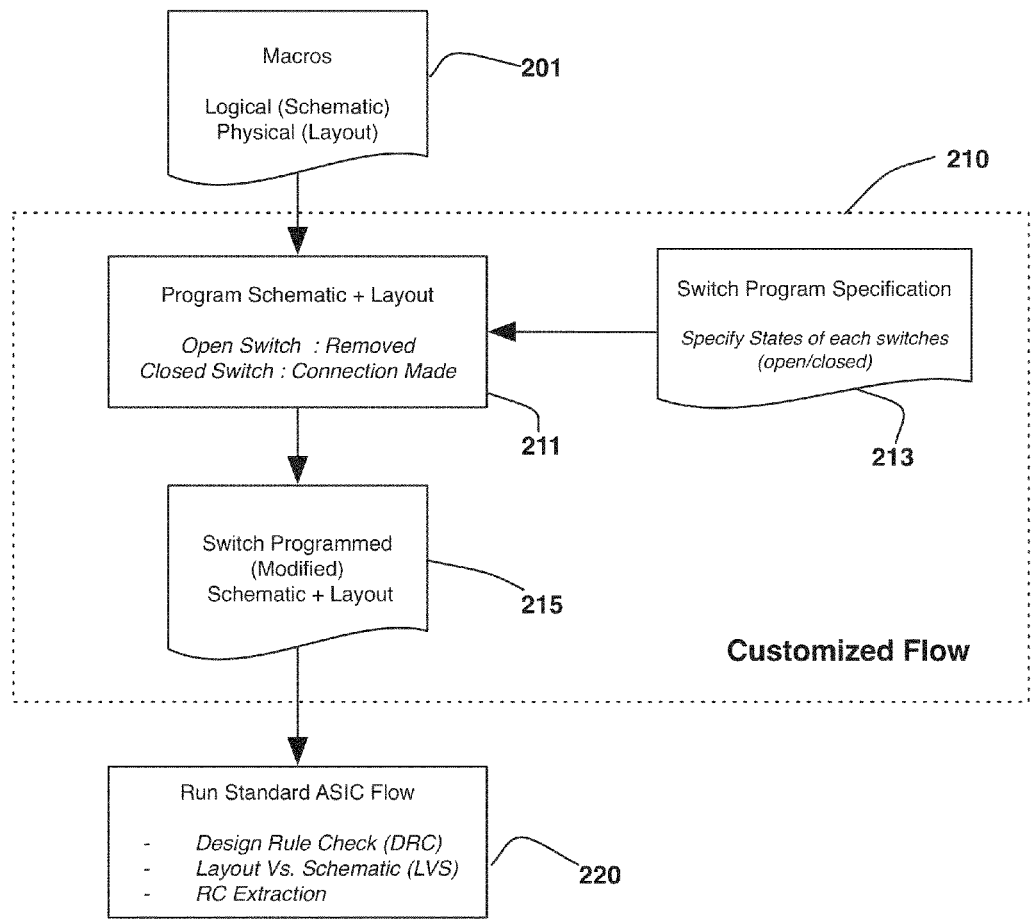
FIG. 2A is a flow chart of an integrated circuit design flow including a customized flow.

Referring to FIG. 2A, a flow chart is shown of a portion of a design methodology that uses programmable macros and switches like those of FIG. 1. In a conventional design methodology, logical (schematic) and physical (layout) designs 201 are input to a standard ASIC or conventional gate array design flow 220. In conventional design flow, there may be numerous logical (schematic) and physical (layout) designs 201 for each customization of the macro with different functionalities. Typical ASIC design flow steps may include, for example, physical verification, design rule checking, layout versus schematic checking, RC parasitic extraction, etc. According to one embodiment, the design flow of FIG. 2A includes additional customized flow steps 210 to allow for programmable macros using soft switches like those of FIG. 1. to generate different personality or functionality of a macro from one logical (schematic) and physical (layout) design 201 which may results in reduction in development and verification time.

In step 211, schematic and layout designs of different macros 201 are programmed. In this step, open (off) switches are removed, and closed (on) switches are shorted with wire. Programming is performed in accordance with one or more switch specifications 213 that determine the state (open/closed) of each switch. Resulting modified schematic and layout designs 215 are then input to step 220.

In accordance with the design methodology of FIG. 2A, the creation of schematic and layout for different programmed instances of macros (i.e., different personality macros) may be fully automated based on a single, un-customized schematic and layout.

Figure 2B:
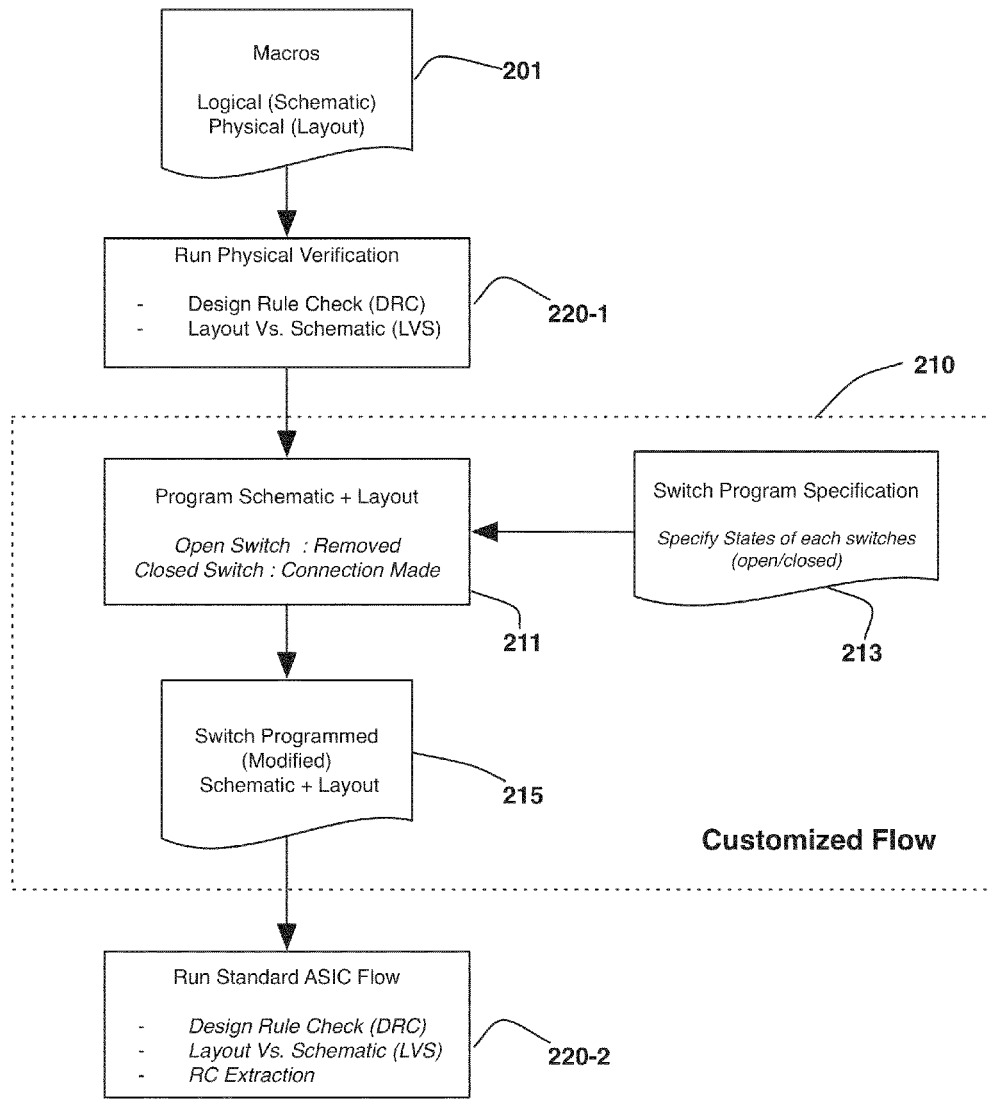
FIG. 2B is a flow chart of another integrated circuit design flow including a customized flow.

Referring to FIG. 2B, a flow chart is shown of a portion of a design methodology that uses programmable macros and switches like those of FIG. 1. As compared to FIG. 2A, steps of the standard ASIC design flow (220 in FIG. 2A) are partitioned. A first group of steps 220-1 includes, in one embodiment, layout versus schematic checking (LVS) and design rule checking (DRC). These steps are performed prior to the additional customized flow steps 210. That is, LVS and DRC steps are performed on uncommitted layout. Following the customized flow steps 210, a remaining group of steps 220-2 of the ASIC design flow are performed.

By performing LVS and DRC on uncommitted layout, the generated layout of different programmed instances of a macro (i.e., different personality macros) is always "LVS and DRC clean" and reduce the development and verification time of different personality macros.

Referring to FIGS. 3A and 3B, cross sectional views are shown of examples of different possible switch layouts. A switch is mapped to or more programmable layout layer— e.g., metal or via—in series or in parallel. In the example of FIG. 3A, the switch has a V23-M3-V23 configuration. In other words, the circuit nodes joined by the switch are joined by the combination of a via, a metal trace and another via. In this example, the metal trace belongs to a metal3 layer M3, and the vias belong to via layer V23 that underlies the metal3 layer and overlies a metal2 layer. In the example of FIG. 3B, the switch has a V23-M3-V34-M4 configuration, observing the same notation.

Referring to FIGS. 4A-4C, 5A-5C and 6A-6C, different switches may share part of the same collection of metal/via programming resources. In the example of FIG. 4A, a node N1, N2, N3 are vertical metal trace represented logically as horizontal and vertical lines. A switch S12 is defined potentially joining nodes N1 and N2. A switch S13 is defined potentially joining nodes N1 and N3. The schematic view of FIG. 4A represents a portion of a base macro design that is currently uncommitted. A corresponding layout representation is shown in FIG. 5A, showing portions of metal traces corresponding to each of nodes N1, N2 and N3, and showing in dashed line a portion of a track T1 within which a metal trace may be formed on a metal layer M3. The track T1 is shared by the switches S12 and S13. A corresponding cross-sectional view is shown in FIG. 6A. In the base design, metal traces corresponding to each of nodes N1, N2 and N3 may occupy a metal layer M2. No structure is present within a via layer V23 and the metal layer M3.

Referring to FIGS. 4B, 5B and 6B, in accordance with a first customization, the switch S12 is turned on, as indicated by the filled-in circles in FIG. 4B, and the switch S13 is turned off (and hence deleted). As seen in FIG. 5B, the switch S12 is realized by the combination of a via contacting the metal of node N1, a metal segment formed within the track T1, and a via contacting the metal of node N2. A corresponding cross-sectional view is shown in FIG. 6B.

Referring to FIGS. 4C, 5C and 6C, in accordance with a second customization, the switch S13 is turned on, as indicated by the filled-in circles in FIG. 4C, and the switch S12 is turned off (and hence deleted). As seen in FIG. 5C, the switch S13 is realized by the combination of a via contacting the metal of node N1, a longer metal segment formed within the track T1, and a via contacting the metal of node N3. A corresponding cross-sectional view is shown in FIG. 6C.

As previously described, if a switch is turned off, it is removed from the resulting schematic. At the same time, resources that were previously reserved for that switch are freed up. These freed-up resources may be used during layout, for example as additional routing resources. This concept is illustrated in FIGS. 7A-7C and 8A-8C. Referring to FIG. 7A, a top view is shown of a portion of a macro having two metal traces joined by an M2-V23-M3-V23 switch structure. The switch structure S occupies a portion of a track T2. Also shown is a metal trace segment M3A that connects to a signal source and a metal trace segment M3B that connects to a signal target, wherein both the metal trace segments M3A and M3B also occupy the track T2. Because a portion of the track T2 is reserved for the switch S, routing between the source and the target is blocked. A corresponding cross-sectional view is shown in FIG. 8A.

When it is determined that the switch S is to be turned off, a portion NS of the track T2 previously reserved for the switch S may be un-reserved, as shown in FIG. 7B and FIG. 8B. As a result, the metal segments M3A and M3B may be joined together as a single metal segment M connecting the signal source and the signal target as shown in FIG. 7C and FIG. 8C. That is, when a macro resource that has been allocated in a metal/via-programmable base array device is unused, the programmable metal and via(s) belonging to the resource may be removed, making way for signal routing as part of the usual place and route flow. The freed-up resources may then be used by "macro-fill-in" features (as in the case of metal joining metal segments M3A and M3B in the example previously described).

In the examples described thus far, it has been assumed that the number of devices (i.e., transistors) belonging to a particular macro remains unchanged regardless of programming of the switches. In other embodiments, devices (un-programmable layers) may be reallocated between macros, enabling a wider range of reprogrammability. This reallocation may be accomplished, for example, by creating a new schematic design of new macro, where designer has full flexibility to restructure the circuit as long as the base layer in the final layout matches the base layer (e.g., polysilicon and diffusion) in the original layout. Referring to FIG. 9A, a top view is shown of portions of two macro cells A and B, each having two devices. As shown in FIG. 10A, the devices may, for example, be MOS transistors each having a diffusion region and a polysilicon gate overlying the diffusion region. It may be desirable to change the allocation of devices between macros A and B. Referring to FIG. 9B, in one example, instead of both macros having two devices, the devices have been reallocated between the macros such that a macro X now has only a single device and a macro Y has three devices. A corresponding view showing the allocation at the diffusion and poly layers is shown in FIG. 10B. Note that the diffusion and poly layers themselves are unchanged.

Figure 11:
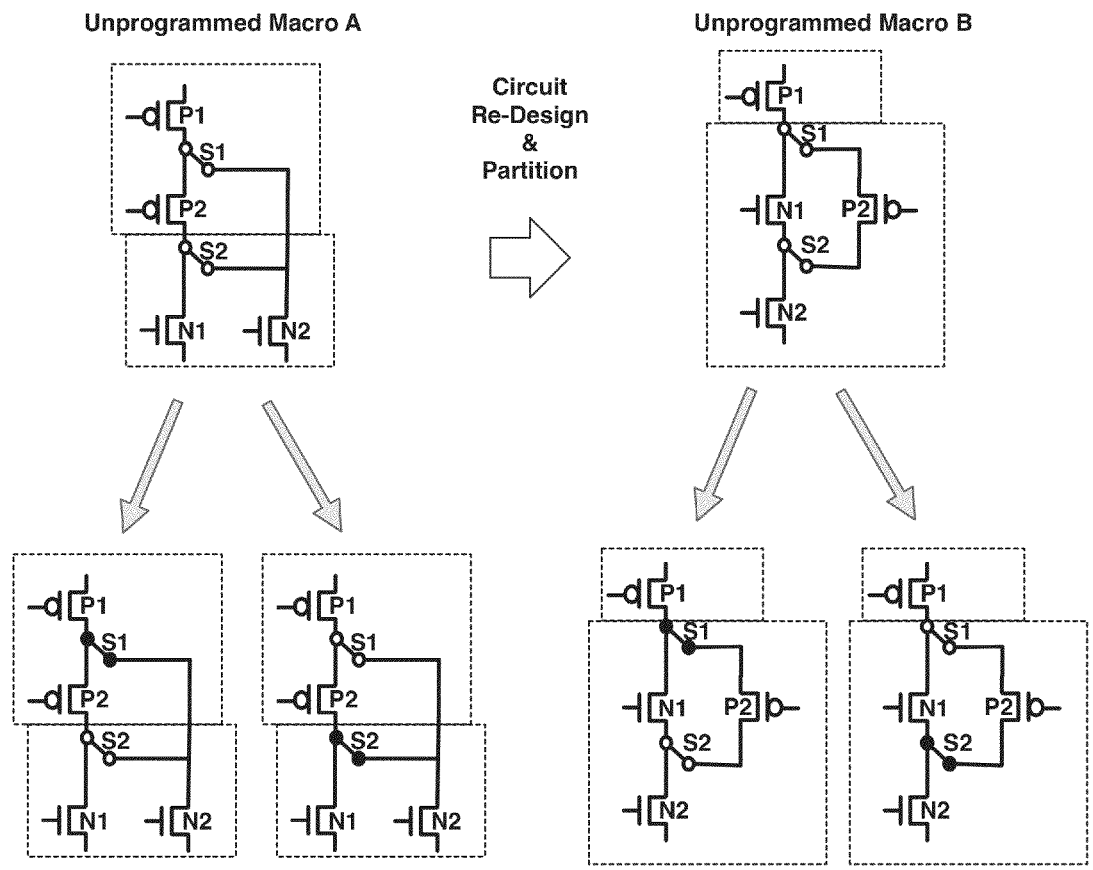
FIG. 11 is a schematic representation illustrating macro substitution or re-design and macro programming.

A further example of reallocating is illustrated in FIG. 11. An original circuit incorporates an instance of an unprogrammed Macro A having an arrangement of P transistors P1 and P2, an arrangement of N transistors N1 and N2, an arrangement of switches S1 and S2, and associated interconnect. Through switch programming, as described previously, the Macro A may be programmed to obtain different personality circuits, two examples of which are shown in FIG. 11. Through circuit re-design and partitioning, the Macro A may be transformed into a different Macro B. The devices available to Macro B are the same as those of Macro A, i.e., P transistors P1 and P2 and N transistors N1 and N2. In this example, Macro B also uses two switches, S1 and S2. These circuit elements, however, are arranged differently in Macro B than in Macro A, realizing a different circuit function. Through switch programming, as described previously, the Macro B may be programmed to obtain different personality circuits, two examples of which are shown in FIG. 11. In FIG. 10 and FIG. 11, the dashed-line boxes represent sub-macros that may be reused between different macros.

Figure 12A:
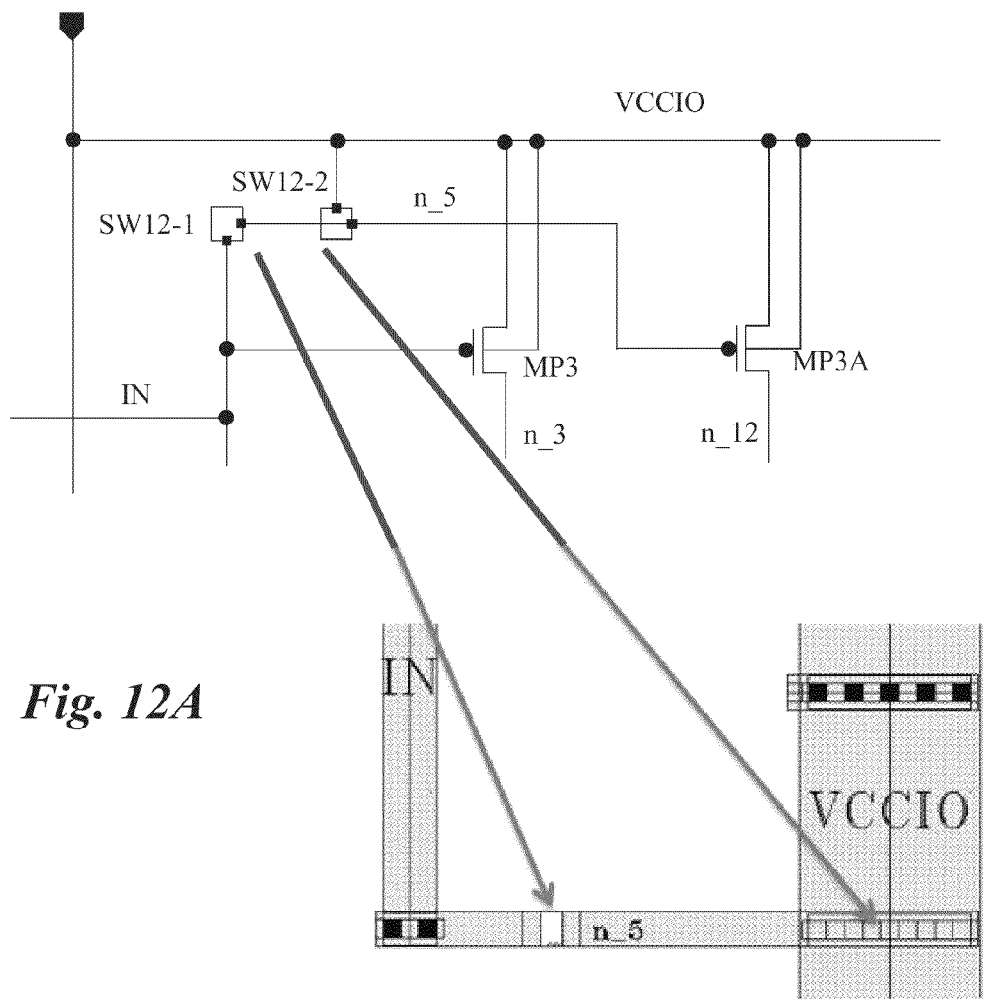
FIG. 12A is a schematic and layout representation of an uncommitted circuit.
Figure 12B:
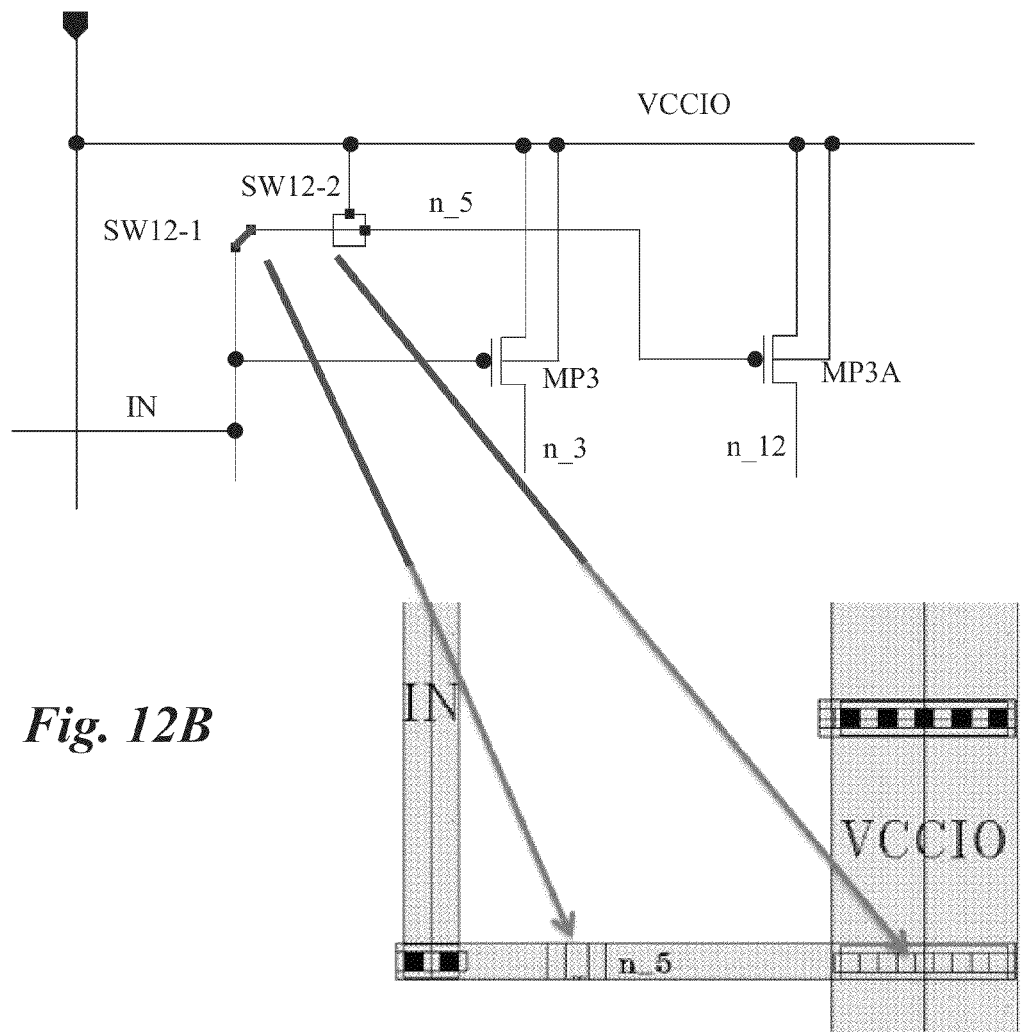
FIG. 12B is a schematic and layout representation of a first customization of the circuit of FIG. 12A.

A further example of circuit customization using programmable switches is illustrated in FIG. 12A to FIG. 12C. Referring to FIG. 12A, a circuit is shown in an uncommitted state. Transistors MP3 and MP3A are provided. A gate electrode of the transistor MP3 is connected to an input IN. Connection of a gate electrode of the transistor MP3A depends on programming of switches SW12-1 and SW12-2. As shown in the lower portion of FIG. 12A, the physical realization of the switch SW12-1 is discontinuity or continuity of a trace $n\_5$. The physical realization of the switch SW12-2 is the presence of absence of vias connecting the trace $n\_5$ to a supply bus VCCIO.

Referring to FIG. 12B, in accordance with a first customization, the switch SW12-1 is programmed to be closed, and the switch SW12-2 is programmed to be open. In the schematic view, the switch SW12-1 is replaced by a connecting line. In the layout view, the metal of trace $n\_5$ is caused to be continuous. In the case of switch SW12-2, in the schematic view, it continues to be represented by a hollow box with contacts contacting the trace $n\_5$ and the supply bus VCCIO. (Note that the trace $n\_5$ extends through the switch SW12-2 and connects to the switch SW12-1 regardless of the programming of the switch SW12-2.) In the layout view, the vias corresponding to the switch SW12-2 that in a closed state of the switch would connect the trace $n\_5$ to the supply bus are left unpopulated.

Referring to FIG. 12C, in accordance with a second customization, the switch SW12-2 is programmed to be closed, and the switch SW12-1 is programmed to be open. In the schematic view, the switch SW12-2 is replaced by a connecting line. In the layout view, the vias corresponding to the switch SW12-2 are populated so as to connect the trace $n\_5$ to the supply bus. In the case of switch SW12-1, in the schematic view, it continues to be represented by a hollow box with contacts contacting the trace $n\_5$ and the input IN. In the layout view, the metal of trace $n\_5$ is caused to be discontinuous.

It will be appreciated by those skilled in the art that the present invention may be embodied in other specific forms without departing from the spirit or essential character thereof. The foregoing description is therefore intended in all respects to be illustrative and not restrictive. The scope of the invention is indicated by the appended claims, not the foregoing description, and all changes that come within the meaning and range of equivalents thereof are intended to be embraced therein.

What is claimed is:

1. A computer implemented method of programmably interconnecting circuit nodes of macrocells of a metal programmable integrated circuit, comprising:

during a design phase:

representing in computer memory each of a plurality of potential interconnections as a graphical feature connecting at least two circuit nodes and displaying at least a portion of a design of the metal programmable integrated circuit showing instances of the graphical features; and for each of the plurality of potential interconnections, reserving physical resources for connecting the at least two circuit nodes, the physical resources consisting of conductors and comprising one or more vias, one or more metal lines, or both one or more vias and one or more metal lines;

wherein different ones of the plurality of potential interconnections have different physical layouts that cannot be substituted for one another; and during a physical layout phase:

specifying in computer memory a state of each of the plurality of potential interconnections as being connected or unconnected, with some of the plurality of potential interconnections being specified as being connected and some of the plurality of potential interconnections being specified as being unconnected; and for each of the plurality of potential interconnections that are specified as being connected, laying out the one or more vias, one or more metal lines, or both one or more vias and one or more metal lines comprising respective ones of the potential interconnections.

2. The method of claim 1, comprising, for a subset of the potential interconnections specified as being unconnected, removing the subset of potential interconnections from representations of the metal programmable integrated circuit.

3. The method of claim 2, wherein removing the subset of potential interconnections results in freed physical resources, comprising using the freed physical resources during a routing process.

4. The method of claim 1, wherein laying out the one or more vias, one or more metal lines, or both one or more vias and one or more metal lines, results in reallocating a device from a first macrocell to a second macrocell.

5. The method of claim 1, wherein different ones of the plurality of potential interconnections share physical resources.

6. A computer implemented method of programmably interconnecting circuit nodes of macrocells of a metal programmable integrated circuit, comprising:

during a design phase:

representing in computer memory each of a plurality of programmable switches as a line con connecting at least two circuit nodes and displaying at least a portion of a design of the metal programmable integrated circuit showing instances of the lines; and for each of the plurality of programmable switches, reserving physical resources for connecting the at least two circuit nodes, the physical resources consisting of conductors and comprising one or more vias, one or more metal lines, or both one or more vias and one or more metal lines;

wherein different ones of the plurality of programmable switches have different physical layouts that cannot be substituted for one another; and during a physical layout phase:

specifying in computer memory a state of each of the plurality of programmable switches as being connected or unconnected, with some of the plurality of programmable switches being specified as being connected and some of the plurality of programmable switches being specified as being unconnected; and for each of the plurality of programmable switches that are specified as being unconnected, laying out the one or more vias, one or more metal lines, or both one or more vias and one or more metal lines comprising respective ones of the programmable switches.

* * * * *